United States Patent [19]

Yoshino

[11] Patent Number: 5,621,742

[45] Date of Patent: Apr. 15, 1997

[54] METHOD AND APPARATUS FOR TESTING SEMICONDUCTOR INTEGRATED CIRCUIT DEVICES

[75] Inventor: Kenji Yoshino, Tokyo, Japan

[73] Assignee: Kawasaki Steel Corporation, Hyogo, Japan

[21] Appl. No.: 478,927

[22] Filed: Jun. 7, 1995

Related U.S. Application Data

[63] Continuation of Ser. No. 171,403, Dec. 22, 1993, abandoned.

[30] Foreign Application Priority Data

Dec. 22, 1992 [JP] Japan ................................. 4-342351

[51] Int. Cl.$^6$ ........................................................ G01R 31/30
[52] U.S. Cl. ............................................. 371/28; 371/22.1
[58] Field of Search ........................... 371/28, 22.1, 22.4, 371/21.1, 21.4; 395/182.2, 182.21, 182.22, 183.18; 365/200, 201

[56] References Cited

U.S. PATENT DOCUMENTS

| | | | |
|---|---|---|---|
| 4,827,208 | 5/1989 | Oliver et al. ............................. | 371/28 |
| 5,025,344 | 6/1991 | Maly et al. .............................. | 371/21.4 |
| 5,107,523 | 4/1992 | Heany et al. ............................ | 371/14 |
| 5,161,161 | 11/1992 | Malek-Khosravi et al. ............... | 371/28 |
| 5,265,099 | 11/1993 | Feinstein ................................. | 371/28 |

FOREIGN PATENT DOCUMENTS

| | | | |
|---|---|---|---|
| 2-67832 | 3/1990 | Japan .............................. | H04B 10/06 |
| 2-118470 | 5/1990 | Japan .............................. | H01L 21/66 |
| 4-76935 | 3/1992 | Japan .............................. | H01L 21/66 |

OTHER PUBLICATIONS

Menozzi et al "An Improved Procedure to Test CMOS ICs for Latch Up" 1990 Int. Test Conference IEEE pp. 1028–1034.

Hidaka et al., "A 34ns 16–Mb DRAM wim Controllable Voltage Down–Converter" IEEE Journal of Solid State Electronics 1992 pp. 1020–1027.

Mammano et al. "A New Linear Regulator Features Switch Mode Over Current Protection" APEC 4th Annual Conf. 1989 IEEE pp. 159–164.

*Primary Examiner*—Robert W. Beausoliel, Jr.
*Assistant Examiner*—Joseph E. Palys
*Attorney, Agent, or Firm*—Oliff & Berridge

[57] ABSTRACT

A method and apparatus for testing a semiconductor integrated circuit device is described. During an aging test of the integrated circuit device, a situation, in which latch up of the semiconductor integrated circuit device can occur, is intermittently created by intermittently supplying a pulse of a power supply voltage $V_b$, which is higher than a normal voltage $V_a$ in accordance with a rated power supply voltage of the tested integrated circuit device. The power supply to the tested semiconductor integrated circuit device is temporarily cut off when latch up occurs. If a second latch up occurs after a restart of the aging test, it is determined that there is an abnormality in the tested semiconductor integrated circuit device. The power supply to the tested semiconductor integrated circuit device is permanently cut off in response to this determination. This prevents damage to the test-object integrated semiconductor device and permits later determination of the degree to which the device is latch up immune.

17 Claims, 7 Drawing Sheets

| ITEM | INSTRUCTION |
|---|---|
| 210 | SET N EQUAL TO THE NUMBER OF LATCH-UP PULSES TO BE GENERATED IN TEST |
| 212 | SUPPLY $V_a$ IN STEADY STATE |
| 214 | SUPPLY LATCH-UP PULSE, $V_b$ |
| 216 | HAS ABNORMAL CONDITION OCCURED? |
| 218 | IS TEST OVER? (N LATCH-UP PULSES HAVE BEEN GENERATED WITHOUT FAIL) |
| 220 | OUTPUT TEST SUCCESSFUL |
| 222 | TEMPORARILY CUT-OFF POWER SUPPLY |
| 224 | HAS FIRST LATCH-UP CRITERIA OCCURED? |
| 226 | HAS FIRST LATCH-UP TEST RESET CRITERIA OCCURED? |
| 228 | RESET FIRST LATCH-UP TEST CONDITIONS |
| 230 | OUTPUT WARNING |
| 232 | SUPPLY LATCH-UP PULSE, $V_b$ |
| 234 | HAS ABNORMAL CONDITION OCCURED? |
| 236 | TEMPORARILY CUT-OFF POWER SUPPLY |
| 238 | HAS SECOND LATCH-UP CRITERIA OCCURED? |
| 240 | OUTPUT TEST FAIL |
| 242 | PERMANENTLY CUT-OFF POWER SUPPLY |
| 244 | IS TEST OVER? (N LATCH-UP PULSES HAVE BEEN GENERATED WITHOUT FAIL CONDITIONS) |
| 246 | OUTPUT TEST SUCCESSFUL |
| 248 | IS TEST OVER? (N LATCH-UP PULSES HAVE BEEN GENERATED WITHOUT FAIL CONDITIONS) |
| 250 | OUTPUT TEST OVER WITH WARNING |

METHOD AND APPARATUS FOR TESTING SEMICONDUCTOR INTEGRATED CIRCUIT DEVICES

This is a Continuation of application Ser. No. 08/171,403 filed Dec. 22, 1993, now abandoned.

BACKGROUND OF THE INVENTION

1. Field of the Invention

This invention relates to a method for testing a semiconductor circuit device which ensures that an aging test of the semiconductor integrated circuit device will continue even if "latch up" occurs during the aging test, and to an apparatus for practicing the method. Also, the present invention makes it possible to inspect a semiconductor integrated circuit device with respect to liability to "latching up".

2. Description of the Related Art

In semiconductor integrated circuit devices, an abnormal increase in temperature in the package may occur due to some internal failure. There is also a risk that an abnormal increase in temperature may occur, due to some other cause, even when the semiconductor integrated circuit device is substantially free from such internal failure.

For example, in semiconductor integrated circuit devices or the like manufactured by a complementary metal oxide semiconductor (CMOS) process, there is a risk that the temperature of the package (or other portions of the device) increases due to "latch up". If "latch up" occurs in such devices, a large current flows and generates heat as Joule's heat. This increases the temperature of the package (or other portions of the device).

If an excessively high voltage is applied to an input terminal in devices having a parasitic pnpn junction, as in CMOS devices, a parasitic pnpn thyristor is turned on and an excess current flows continuously, resulting in device breakdown in some cases. This is called "latch up".

Even CMOS semiconductor integrated circuits of the same model vary in a property expressed as "liability to" or "immunity from" latch up (this property is hereinafter referred to as "latch up immunity").

In the case of devices having weak latch up immunity, there is a risk that latch up will occur even under ordinary operating conditions, in which external noise is always small. Even in devices having strong latch up immunity, latch up may occur if a large external noise is mixed in.

Conventionally, an aging test has been practiced, where a plurality of semiconductor integrated circuit devices to be tested are placed on one aging board. The plurality of devices are continuously operated by applying a power supply voltage in accordance with a rated power supply voltage of the integrated circuits. If latch up occurs in semiconductor integrated circuit devices having weak latch up immunity during such a conventional aging test, the devices are removed as defectives.

However, in this process, where those semiconductor integrated circuit devices in which latch up has occurred during an aging test are simply removed, as described above, the degree of latch up immunity of the removed semiconductor integrated circuit devices is not known. Also, when latch up occurs in a semiconductor integrated circuit device during an aging test, the semiconductor integrated circuit device is broken. Therefore, it is impossible to continue the operation test of the semiconductor integrated circuit device in which latch up has occurred during an aging test.

In some conventional methods, if latch up occurs in one of semiconductor integrated circuit devices tested by an aging test, all semiconductor integrated circuit devices in the lot containing the latched up device are thrown away. This is because the liability to latch up is latent in semiconductor integrated circuit devices and there is a risk of allowing defective devices to be sold.

For example, even if latch up occurs in only one CMOS semiconductor integrated circuit device, several hundred CMOS semiconductor integrated circuit devices in the lot containing the latched up device may be thrown away. Use of such a method imposes a large burden on manufacturing semiconductor integrated circuit devices in terms of manufacturing cost.

However, it is possible to avoid such useless disposal, if the degree of latch up immunity can be accurately determined.

SUMMARY OF THE INVENTION

In view of the above-described problems, this invention provides a semiconductor integrated circuit device testing method which makes it possible both to continue an aging test even if latch up occurs during the aging test and to inspect a device to determine its degree of latch up immunity.

The present invention has been achieved by considering the fact that it is necessary to set uniform test conditions, in order to improve the test accuracy with respect to latch up of semiconductor integrated circuit devices. According to the present invention, therefore, an integrated circuit device testing apparatus creates a testing situation, where the test itself causes latch up in the tested devices.

Also, the present invention has been achieved by considering the necessity of ensuring, for an improvement in aging test accuracy, that a semiconductor integrated circuit device in which latch up has occurred during an aging test can be reexamined by an operation test or the like.

According to the present invention, a certain condition for intentionally causing latch up can be created. Therefore, the test accuracy relating to latch up can be improved.

Also, according to the present invention, even if latch up occurs during testing, the power supply to the tested integrated circuit device can be cut off before the device is damaged by the development of heat caused by the abnormal current.

Specifically, according to the present invention, after an abnormal current is detected, the power supply is temporarily cut off and testing is thereafter restarted. When two or more successive abnormal currents are detected, the power supply to the tested integrated circuit device is permanently cut off, as described above. Therefore, it is possible to evaluate the degree of latch up immunity with improved accuracy, as the latched up device is not destroyed by the test apparatus.

DESCRIPTION OF THE PREFERRED EMBODIMENTS

One embodiment of the present invention will be described below in detail with reference to the accompanying drawings. The operation of the present invention will be described below with reference to FIG. 1.

Figure 1:
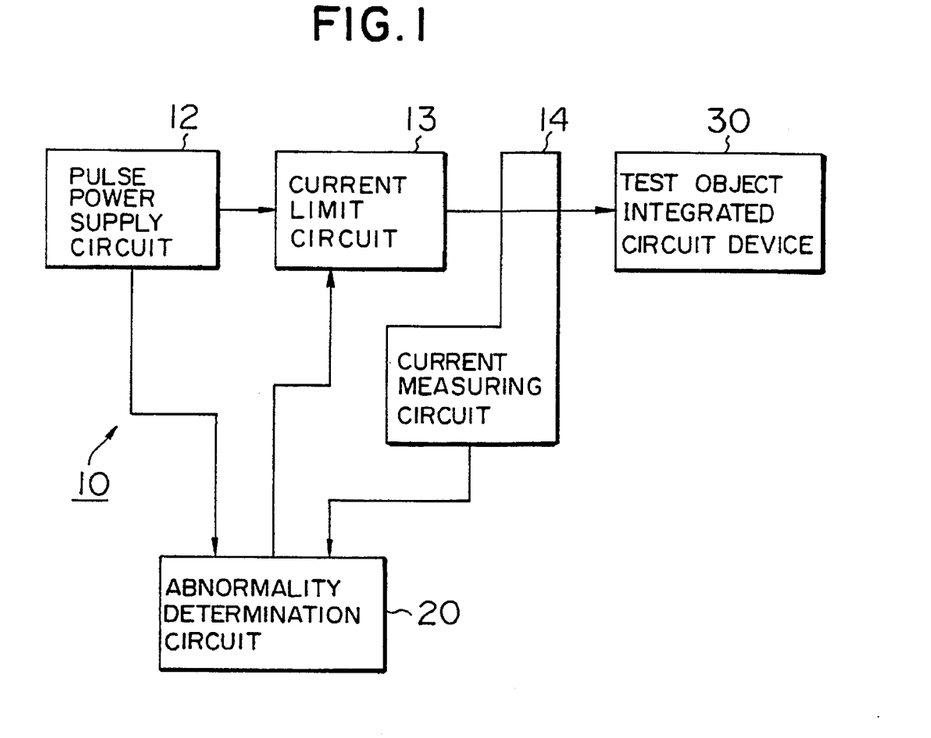
FIG. 1 is a block diagram schematically showing the configuration of an integrated circuit device testing apparatus.

As shown in FIG. 1, an apparatus 10 for testing a test-object semiconductor integrated circuit device 30 in accordance with the present invention comprises a pulse power supply circuit 12, a current limit circuit 13, a current measuring circuit 14, and an abnormality determination circuit 20.

The pulse power supply circuit 12 supplies, to the test-object integrated circuit device 30, a first power supply voltage, $V_a$, which is equal to a rated power supply voltage of the test-object integrated circuit device 30. The first power supply voltage $V_a$ is supplied in a steady state by the pulse power supply circuit 12. The pulse power supply circuit 12 also supplies a second power supply voltage, $V_b$, which is higher than the first voltage $V_a$, and which is supplied to the test-object integrated circuit device 30 intermittently in pulses. The pulse power supply circuit 12 intentionally creates a situation in which latch up easily occurs, by controlling the power supply voltage supplied to the test-object integrated circuit device 30. A situation for intentionally causing latch up of a certain degree can thus be created by using the pulse power supply circuit 12.

The current limit circuit 13 serves to cut off the power supply voltage, $V_a$ and $V_b$, supplied by the pulse power supply circuit 12 to the test-object integrated circuit device 30 in accordance with a cut off control signal, as described below. The current limit circuit 13 may be any known switching device inserted in the power supply line from the pulse power supply circuit 12 to the test-object integrated circuit device 30.

The current measuring circuit 14 measures the power supply current flowing from the pulse power supply circuit 12 to the test-object integrated circuit device 30.

The abnormality determination circuit 20 determines if an abnormal condition exists based on the current measurement supplied by the current measuring circuit 14. If the abnormality determination circuit 20 determines that an abnormal current is flowing through the test-object integrated circuit device 30, it temporarily generates a cut off control signal and supplies this signal to the current limit circuit 13. The current limit circuit 13, when it receives the cut off control signal, cuts off the power supply from the pulse power supply circuit 12 to the test-object integrated circuit device 30.

The abnormality determination circuit 20 also determines, from the current measurement supplied by the current measuring circuit 14, whether two (or more) successive abnormal power supply currents have occurred. When an abnormal current occurs as described above, the abnormality determination circuit 20 temporarily generates the cut off control signal to cut off the power supply to the test-object integrated circuit 30, and then restarts the power supply. If the abnormality determination circuit 20 determines that a second (or subsequent) abnormal power supply current occurs after the power supply is restarted, it determines that latch up has re-occurred and that the tested integrated circuit device has weak latch up immunity. This corresponds to the case of continuous abnormal signal generation described above.

If the abnormality determination circuit 20 determines that two (or more) successive abnormal currents have occurred, it then positively determines that the test-object integrated circuit device 30 is defective. In this case, the abnormality determination circuit 20 permanently supplies the cut off control signal to the current limit circuit 13 to cut off the power supply to the test-object integrated circuit device 30. The abnormality determination circuit may also generate a stop signal to stop the power supply operation of the pulse power supply circuit 12.

The power supply to the test-object integrated circuit device 30 is thus cut off when two (or more) successive abnormal power supply currents occur, as described above. Thus, damage to the test-object integrated circuit device 30 from the heat caused by the abnormal current is prevented.

Therefore, damage to the test-object integrated circuit device 30 is prevented and it becomes possible, by an operation test or the like, to reexamine the test-object integrated circuit devices 30 in which two (or more) successive abnormal currents have occurred.

Figure 2:
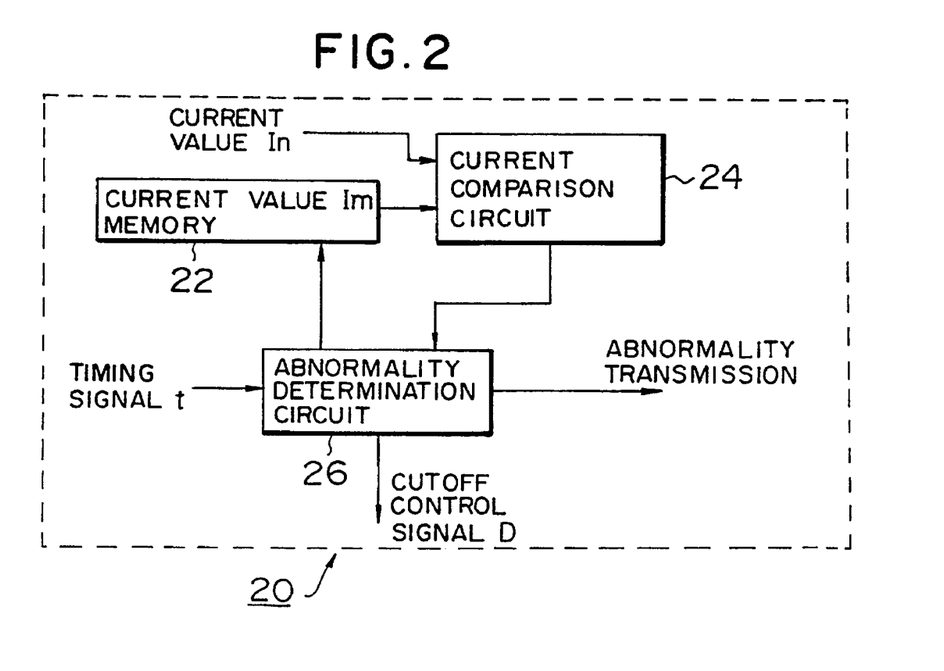
FIG. 2 is a block diagram of an abnormality determination circuit used in an integrated circuit device testing apparatus of FIG. 1.

FIG. 2 is a block diagram of the configuration of the abnormality determination circuit 20 used in the preferred embodiment described above.

As shown in FIG. 2, the abnormality determination circuit 20 of this embodiment comprises a current value memory 22, a current comparison circuit 24 and an abnormality determination circuit 26. The current value memory 22 store the value of a past current $I_m$. The current comparison circuit 24 compares the present current, $I_n$ flowing from the pulse power supply 12 to the test-object integrated circuit device, as represented by the measurement signal from the current measuring circuit 14, with a latch up current value, $I_L$. The abnormality determination circuit 26 counts the number of previous successive latch up occurrences, determines if the comparison from the current comparison circuit 24 indicates latch up has occurred, and generates the cut off signal. The thus-arranged abnormality determination circuit 20 operates as shown in a flowchart of FIG. 3.

Figure 3:
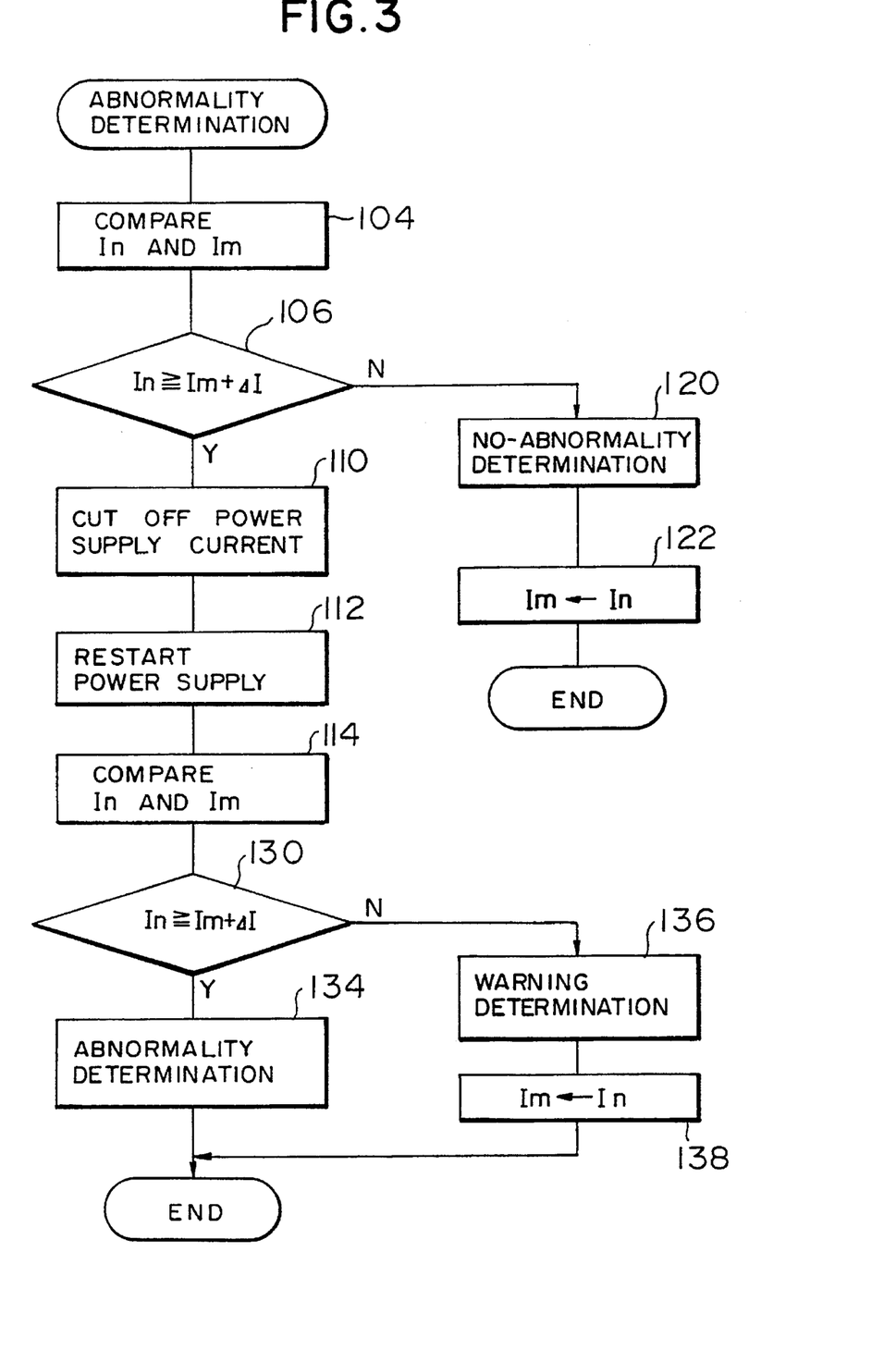
FIG. 3 is a flowchart showing the method of operation of the integrated circuit device testing apparatus of FIG. 1.

In the flowchart of FIG. 3, the sequence of steps of the operation of the integrated circuit device testing apparatus of this embodiment is shown, mainly in the operation of the abnormality determination circuit 20.

First, in step 104, as shown in FIG. 3, a present current value $I_n$ and a past current value $I_m$ are compared. The past current $I_m$ is the normal operating current. Then, in step 106, a determination is made whether the present current value $I_n$ is at least equal to the latch up current $I_L$, where:

$$I_L = I_m + \Delta I \tag{1}$$

where $\Delta I$ is a discrimination current.

In this embodiment, the value of the discrimination current $\Delta I$ is obtained by the following equation:

$$\Delta I = (I_b - I_a) + \alpha \text{ or } \Delta I = )_b - I_a) \tag{2}$$

Figure 7:
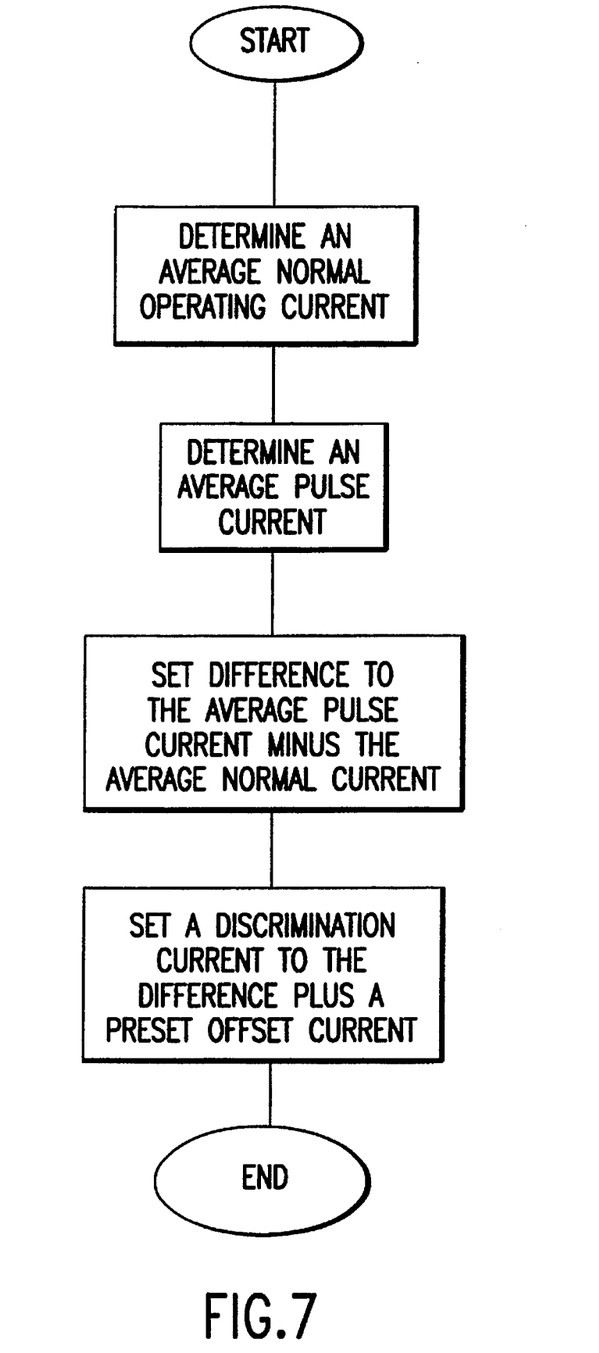
FIG. 7 is a flow chart of a method to determine average currents.

The current value $I_a$ in Eq. 2 represents the power supply current supplied to the test-object integrated circuit device 30 when the voltage $V_a$ is supplied to the device 30 by the pulse power supply circuit 12. The current value $I_a$ corresponds to values indicated by the same reference symbols in time charts of FIGS. 4 and 5 described below. Alternately, the current value $I_a$ represents the average value of the power supply current supplied during the $V_a$ intervals as shown in FIG. 7.

The current value $I_b$ in Eq. 2 represents the power supply current supplied to the test-object integrated circuit device 30 when the voltage $V_b$ is supplied to the device 30 by the pulse power supply circuit 12. The current value $I_b$ corresponds to values indicated by the same reference symbols in the time charts of FIGS. 4 and 5 described later. Alternately, the current value $Ib$ represents the average value of the power supply current supplied during the $V_b$ intervals, as shown in FIG. 7. $\alpha$ is the value of a margin for the above-mentioned determination using the discrimination current $\Delta I$.

If, in step 106, it is determined that the difference between $I_m$ and $I_n$ is equal to or greater than $\Delta I$, (i.e., $I_n \geq I_m + \Delta I$) the process proceeds to step 110. If it is determined that the difference is smaller than $\Delta I$, the process proceeds to step 120.

The current value $I_n$ is the present current value measured by the current measuring circuit 14. The current value $I_m$ is a past current value measured by the current measuring circuit 14 during an interval where the operation of the test-object integrated semiconductor device 30 is regarded as normal. This current value $I_m$ is stored in the current value memory 22 in step 122 or 138, as described below.

In step 110, since the present current value $I_n$ is greater than $I_m$ by $\Delta I$ or more, the power supply, from the pulse power supply circuit 12 to the test-object integrated circuit device 30, is cut off. In step 112, the power supply cut off in step 110 is restarted.

The sequence of power supply operations performed in steps 110 and 112 is performed by temporarily outputting the cut off control signal D from the abnormality determination section 26 of the abnormality determination circuit 20 to the current limit circuit 13. That is, during the period of time through which the cut off control signal D is output, the current limit circuit 13 cuts off the power supply from the pulse power supply circuit 12 to the test-object integrated circuit 30.

On the other hand, when the process branches off to proceed from step 106 to step 120 by the determination that the current value $I_n$ is not greater by $\Delta I$ or more (i.e., $I_n < I_m + \Delta I$), it is determined in step 120 that there is no abnormality. Then, in step 122, the present current value $I_n$ presently obtained from the current measuring circuit 14 is written into the current value memory 22 as the past current value $I_m$. After the operation of steps 120 and 122, step 124 determines if the test is completed. If, in step 124, it is determined that the test is not over, the process jumps back to step 104.

In step 114, the present current value $I_n$ and the past current value $I_m$ are again compared. Then, in step 130, the determination is again made whether the present current value $I_n$ is greater than the past circuit value $I_m$ by $\Delta I$ or more (i.e., $I_n \geq I_m + \Delta I$). If it is determined that the current value $I_n$ is again greater than the past current value $I_m$ by $\Delta I$ or more (i.e., $I_n \geq I_m + \Delta I$), the process proceeds to step 134. It is then determined, in step 134, that there is an abnormality.

However, if in step 130, it is determined that the present current value $I_n$, is not greater than the past current value $I_m$ by at least $\Delta I$ (i.e., $I_n < I_m + \Delta I$), the process proceeds to step 136.

In response to the determination in steps 130 and 134, the power supply to the test-object integrated circuit device 30 is cut off because two (or more) successive abnormal power supply currents occur in the power supplied to the test-object integrated circuit device 30.

That is, this is because after it has been once determined in steps 104 and 106 that a first abnormal current has occurred, it is determined in steps 114 and 130 that a second (or subsequent) abnormal current has occurred.

On the other hand, in step 136, it is determined that only a warning will be given, since a normal current value $I_m$ is obtained after the generation of the first abnormal current In has been recognized.

In this case, the above-described operation of cutting off the power supply to the test-object integrated circuit device 30 of step 134 is not performed, but a warning display, as in step 136, is output to a user of the integrated circuit testing apparatus.

In step 138, the present current value $I_n$ presently measured by the current measuring circuit 14 is written in the current value memory 22 as the past current value $I_m$. After step 138, step 140 determines if the test is completed. If, in step 140, it is determined that the test is not over, the process jumps back to step 130.

Figure 4:
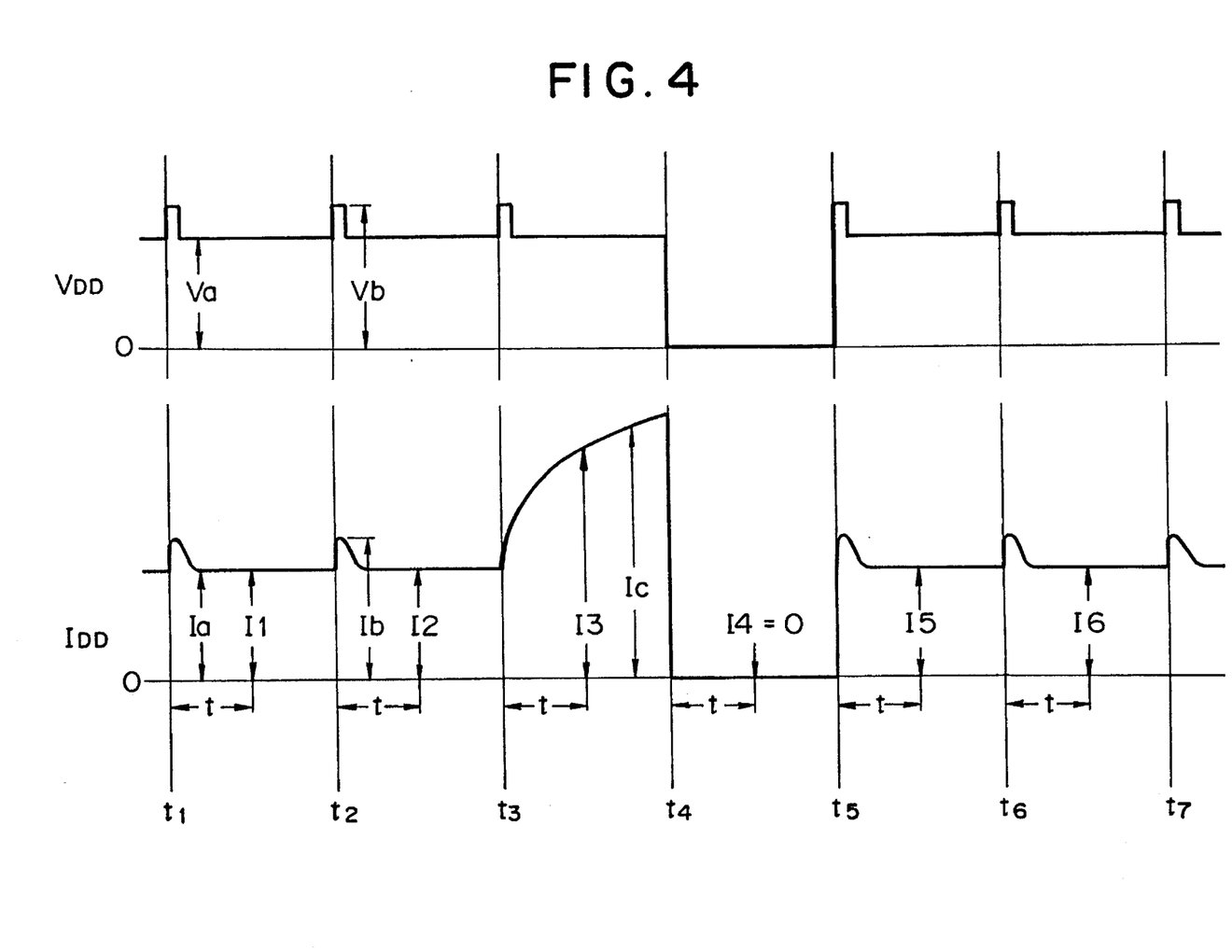
FIG. 4 is a time chart relating to the method of operation of the testing apparatus when a single abnormal current is detected.

FIG. 4 is a time chart of the operation of this embodiment when a single abnormal current is caused temporarily. In the time chart of FIG. 4, a timing diagram of the power supply voltage $V_{DD}$ is shown, with respect to the power supply current $I_{DD}$ of the power supply from the pulse power supply circuit 12 to the test-object integrated circuit device 30 through the current limit circuit 13.

Referring to FIG. 4, the power supply voltage $V_a$ is supplied to the test-object integrated circuit device 30 as a steady-state voltage through the period of time from $t_1$ to time $t_4$ and through the period from time $t_5$ to at least time $t_7$. At each of time periods $t_1$ to $t_3$ and time periods $t_5$ to $t_7$, the power supply voltage is momentarily raised to $V_b$, which is higher than the steady state voltage $V_a$, and is supplied as a pulse to the test-object integrated circuit device 30. As set forth above, the steady-state voltage $V_a$ is a voltage adjusted to the rated power supply voltage of the test-object integrated circuit device 30.

In this embodiment, the power supply voltage $V_b$ is intermittently supplied as a pulse to the test-object integrated circuit device 30 to intentionally create a situation where latch up can easily occur in the test-object integrated circuit device 30. Thus, the power supply current $I_{DD}$ has a current value of $I_a$ when the voltage $V_a$ is supplied, and has a current value of $I_b$ when the voltage $V_b$ is supplied.

During the test of this embodiment, performed as described above, pulses of the power supply voltage $V_b$ are supplied to the test-object integrated circuit device 30 to cause latch up to occur. That is, during latch up, the power supply current $I_{DD}$ increases gradually from time $t_3$ and increases to a current value of $I_c$ immediately before time $t_4$. Accordingly, in this embodiment, the power supply is temporarily cut off for the period from time $t_4$ to time $t_5$.

This operation is performed by temporarily outputting the cut off control signal D from the abnormality determination section 26 of the abnormality determination circuit 20 to the current limit circuit 13. In FIG. 4, no particular abnormal power supply current occurs after the single latch up occurrence and after the period for temporarily cutting off the power supply, as mentioned above. That is, the operation shown in FIG. 4 corresponds to "WARNING DETERMINATION" of step 136 shown in FIG. 3.

Figure 5:
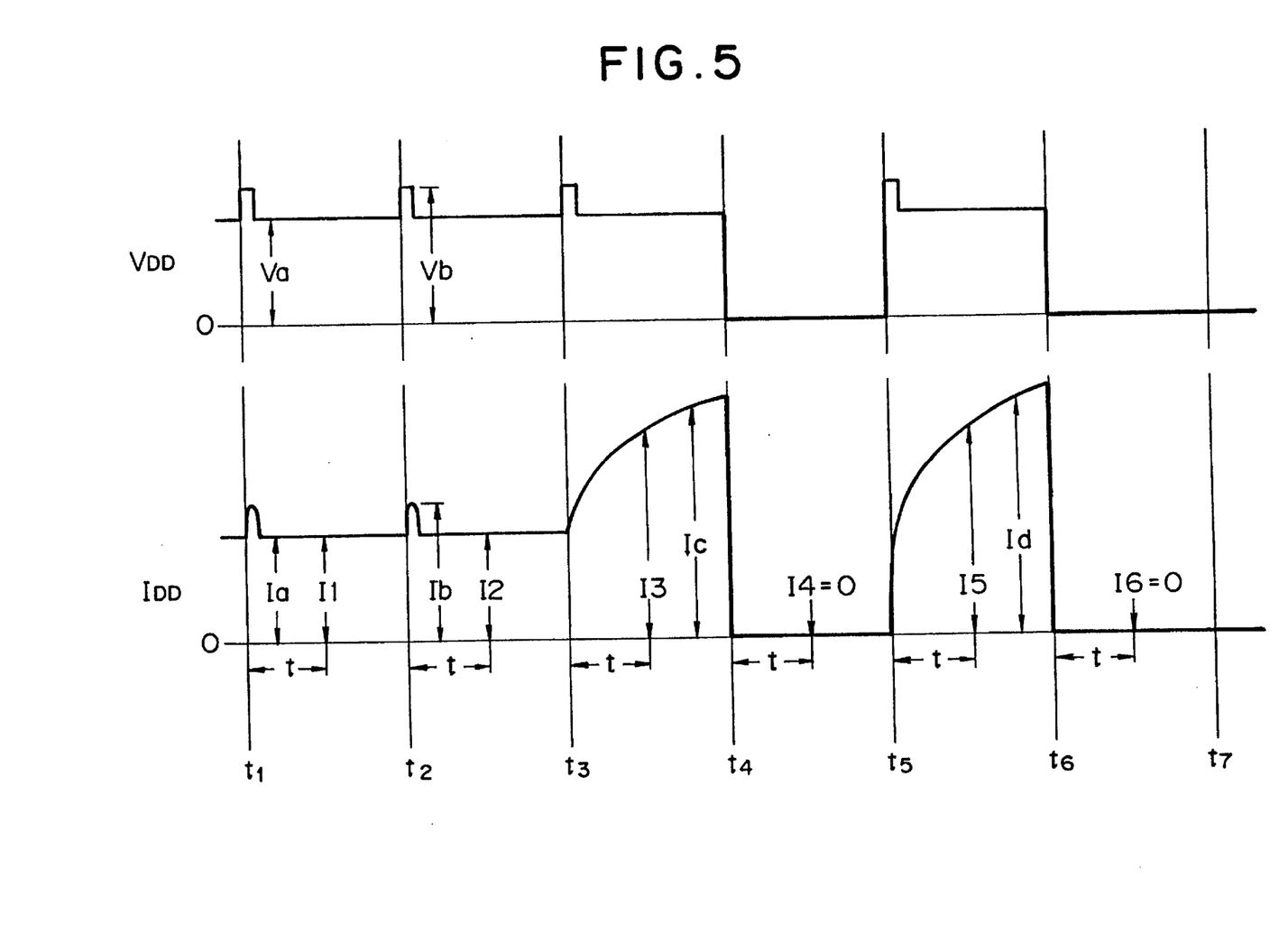
FIG. 5 is a time chart relating to the method of operation of the testing apparatus when successive abnormal currents occur.

FIG. 5 is a time chart of the operation of this embodiment when successive abnormal currents occur. The time chart of FIG. 5 shows the operation in the case where the latch up immunity of the device is weak and where the abnormality determination circuit 20 determines that successive abnormal power supply currents have occurred. The time chart of FIG. 5 differs from that of FIG. 4 particularly with respect to the state after time $t_5$.

In the period from time $t_3$ to $t_4$ shown in FIG. 5, a first latch up occurs, as in the case shown in FIG. 4. Subsequently, the power supply to the test-object integrated circuit device 30 is cut off for the period from time $t_4$ to time $t_5$, as in the case shown in FIG. 4.

The power supply is restarted at time $t_5$. Thereafter, a second latch up occurs in the period from time $t_5$ to time $t_6$. In contrast, in the case shown in FIG. 4, no second latch up occurs in the period from time $t_5$ to time $t_6$. Since the second latch up occurs successively with the first latch up, in the case shown in FIG. 5, the power supply to the test-object integrated circuit device 30 is permanently cut off after time $t_6$.

This operation is performed in such a manner that the abnormality determination section 26 of the abnormality determination circuit 20 continuously outputs the cut off control signal D to the current limit circuit 13 after time $t_6$ and stops the power supply operation of the pulse power supply circuit 12.

Thus, even if two successive latch ups occur, almost all of the test-object integrated circuit devices 30 are substantially free from internal damage or the like, since the power supply is continuously cut off after time $t_6$. Therefore, it is possible to reexamine the integrated circuit devices by the test using the integrated circuit testing apparatus of this embodiment and other various operation tests.

The integrated circuit device 30 tested by the apparatus of this embodiment is a CMOS integrated circuit in which latch up may occur. In such a CMOS integrated circuit, the power supply current $I_{DD}$ varies even when the power supply voltage $V_{DD}$ is constant. In particular, when an internal CMOS transistor is switched in accordance with the circuit operation in the CMOS integrated circuit device, a through-current occurs such that the power supply current $I_{DD}$ is increased instantaneously.

In this embodiment, therefore, the abnormality determination circuit 20 monitors the measurement result from the current measuring circuit 14 a time t after each of times $t_1$ to $t_7$, as shown in FIG. 5. It is thereby possible to prevent occurrence of a determination error due to such an instantaneous increase (change) in the power supply current $I_{DD}$. In more detail, determination is made as to whether the power supply current $I_{DD}$ has increased by the above-mentioned discrimination value $\Delta I$ in the period of time t.

In this embodiment, as described above, a situation in which latch up occurs easily can be intentionally created during the aging test which is performed by applying the power supply voltage $V_a$ to the test-object integrated circuit device 30. Also, if any latch up caused in this manner is not followed by another latch up, the aging test can be continued. Also, if it is determined that two successive latch ups have occurred, the pulse power supply 12 can be cut off to prevent the test-object integrated circuit device 30 from being damaged by an abnormal current.

In this embodiment, the voltage $V_a$ is determined in accordance with the rated power supply voltage of the test-object integrated circuit device 30. For example, if the rated power supply voltage of the test-object integrated circuit device 30 has a certain allowable range about a median value, for example, the range of 0–2 V about a median value of 5 V, the voltage $V_a$ may be set to 7 V corresponding to a voltage greater than the median value but less than the upper limit of this range.

In this embodiment, the voltage $V_b$ is a voltage higher than the voltage $V_a$ and within a range such that there is no possibility of a damage in the test-object integrated circuit device 30. For example, $V_b$ is selected so that it is higher than the voltage $V_a$ and so that is lower than the voltage at which insulation breakdown can be caused in the test-object integrated circuit device 30.

The width of pulses intermittently applied as the voltage $V_b$ is a time length such that there is no risk of the power supply current $I_{DD}$ being increased to cause internal damage by internal heat development. This pulse width also depends upon the time intervals at which the power supply voltage $V_b$ is intermittently supplied, i.e., the time intervals between the pulses.

The time t shown in FIGS. 4 and 5 is short enough to ensure that the abnormal current determination is not influenced by variations in the power supply current $I_{DD}$ due to the internal operation of the test-object integrated circuit device 30.

The present invention is not limited to the above-described embodiment. For example, latch up occurrence determination may be made by a method using the rate of increase in the power supply current $I_{DD}$ after the application of the pulse current to the test-object integrated circuit device 30 instead of the above-described method of recognizing the occurrence of latch up from the increase by the discrimination current $\Delta I$ in the power supply current $I_{DD}$.

In the above-described embodiment, an abnormality in the test-object integrated circuit device is recognized if two successive latch ups occur. However, the determination criterion may be selected in accordance with one's need. For example, an abnormality in the test-object integrated circuit device may be recognized only if three (or more) successive latch ups occur.

Figure 6A:
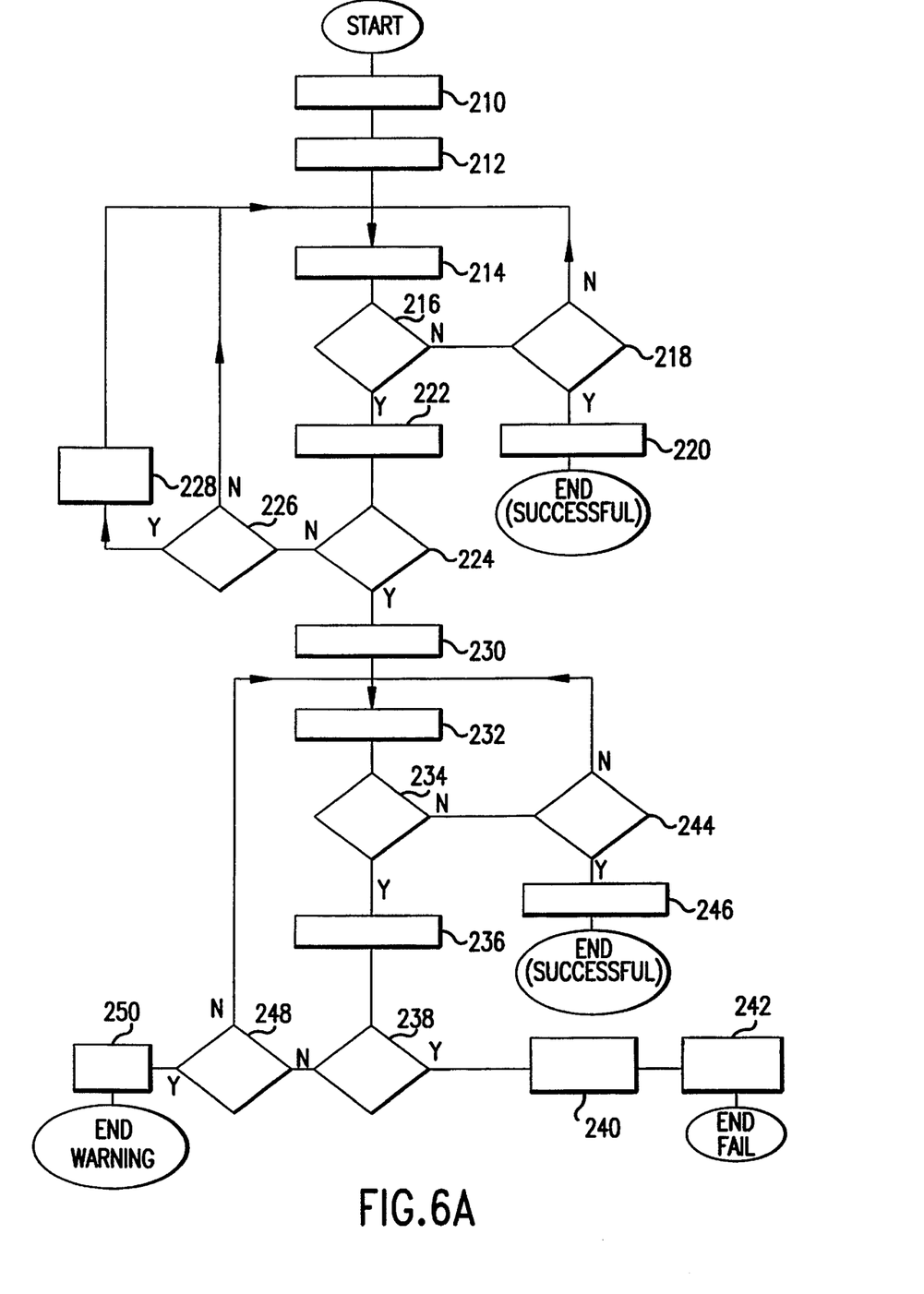
FIG. 6A and 6B are a flow chart showing a method of operations of the testing apparatus.
Figure 6B:
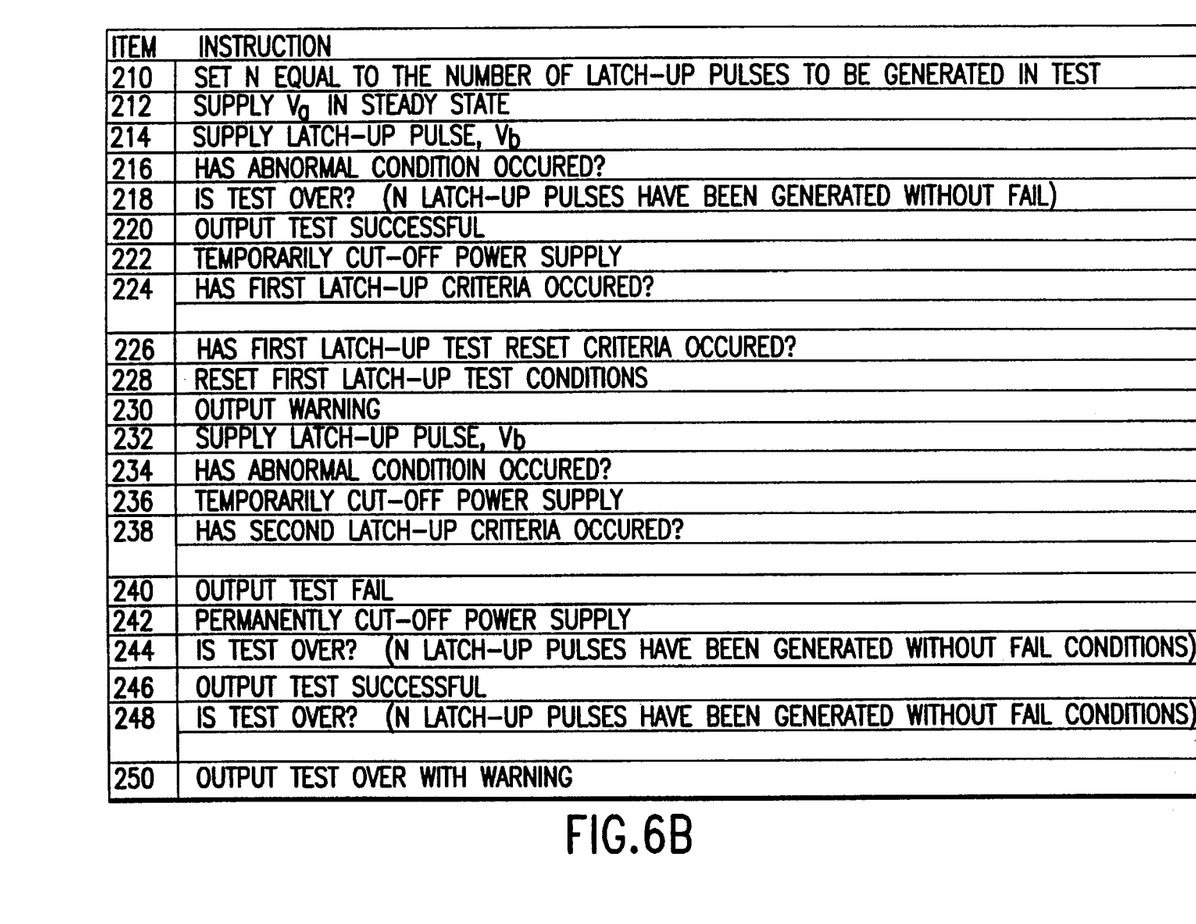

Finally, in a device having weak latch up immunity, the second latch-up may occur within a predetermined number of subsequent time periods t after the first latch up, rather than the next following time period. Thus, in a further embodiment, the power supply is permanently cut off and the test-object integrated circuit device regarded as defective if the second latch up occurs within the predetermined number of subsequent time period intervals or pulses. FIG. 6A and FIG. 6B outline a test procedure for this situation.

According to the present invention, as described above, an aging test can be continued even if latch up occurs during the aging test, and the test object can be examined with respect to the degree of latch up immunity.

What is claimed is:

1. A method for testing a semiconductor integrated circuit device, comprising the steps of:

(a) supplying a power supply voltage to the semiconductor integrated circuit device;

(b) intermittently generating a latch up pulse in the power supply voltage to the semiconductor integrated circuit device;

(c) determining whether a latch up condition is present in the semiconductor integrated circuit device;

(d) temporarily cutting off the power supply voltage to the semiconductor integrated circuit device when the latch up condition is present;

(e) resupplying the power supply voltage to the semiconductor integrated circuit device;

(f) generating additional latch up pulses in the power supply voltage;

(g) determining whether additional latch up conditions are present in the semiconductor integrated circuit device within a predetermined number of the additional latch up pulses;

(h) cutting off the power supply to the semiconductor integrated circuit device when a predetermined number of additional latch up conditions are present in the predetermined number of additional latch up pulses; and (i) repeating steps (b–h) when the additional latch up conditions do not occur in the predetermined number of latch up pulses.

2. The method of claim 1, wherein the latch up pulse generating step comprises generating a latch up voltage pulse having a voltage greater than a rated power supply voltage of the semiconductor integrated circuit device.

3. The method of claim 2, wherein the latch up pulse generating step comprises generating a latch up voltage pulse having a voltage less than a breakdown voltage of the semiconductor integrated circuit device.

4. The method of claim 1, wherein the determination steps each comprise the steps of:

determining a normal operating current;

determining a pulse operating current; and determining if an actual operating current of the semiconductor integrated circuit device is at least equal to a latch up current, the latch up current being not less than the pulse operating current.

5. The method of claim 4, wherein the normal operating current determining step comprises the steps of:

determining if the actual operating current of the semiconductor integrated circuit device is between a previous normal operating current value and the latch-up current; and resetting the normal operating current to the actual operating current when the actual operating current is between the previous normal operating current value and the latch-up current.

6. The method of claim 4, further comprising the step of determining discrimination current by subtracting the normal operating current from the pulse operating current, wherein latch up current is equal to the pulse operating current and the discrimination current.

7. The method of claim 4, further comprising the step of determining a discrimination current, wherein the discrimination current determining step comprises the steps of:

subtracting the normal operating current from the pulse operating current; and adding an offset current to the pulse operating current.

8. The method of claim 4, further comprising the step of determining a discrimination current, wherein the discrimination current determining step comprises:

determining an average normal operating current;

determining an average pulse current; and subtracting the average normal operating current from the average pulse current.

9. The method of claim 1, wherein the predetermined number of additional latch up pulses is one.

10. The method of claim 1, wherein the predetermined number of additional latch up conditions is at least one.

11. The method of claim 1, wherein the determination steps are based on a rate of increase in a power supply current after each application of the latch up pulse.

12. A non-destructive testing apparatus for a semiconductor integrated circuit device, comprising:

a pulse power supply for supplying voltage to the semiconductor integrated circuit device;

a current measuring circuit for measuring a current flowing in the semiconductor integrated circuit device;

an abnormal condition determining circuit for determining an abnormal current condition in the semiconductor integrated circuit device based on the measured current, and for outputting a power supply cut off signal upon determining an abnormal current condition exists; and a current limiting circuit for receiving the power supply cut off signal and for turning off the pulse power supply in response to the power supply cut off signal;

wherein the abnormal condition circuit temporarily outputs the power supply cut off signal after each of a first predetermined number of abnormal current conditions are determined and permanently outputs the power supply cut off signal after a second predetermined number of abnormal current conditions are determined, wherein the second predetermine number is greater than the first predetermined number.

13. The non-destructive testing apparatus of claim 12, wherein the first predetermined number is one, and the second predetermined number is two.

14. The non-destructive testing apparatus of claim 12, wherein the first predetermined number is at least two, and the second predetermined number is at least three.

15. The non-destructive testing apparatus of claim 14, wherein the second predetermined number is one greater than the first predetermined number.

16. The non-destructive testing apparatus of claim 12, wherein the pulse power supply generates a steady state voltage signal having a first voltage level, and a pulse voltage signal having a second voltage level greater than the first voltage level.

17. The non-destructive testing apparatus of claim 12, wherein the abnormal current condition determining circuit comprises:

a normal operating current determining circuit for determining a first current level representative of a normal operating condition of the semiconductor integrated circuit device;

a pulse operating current determining circuit for determining a second current level representative of a pulse operating condition of the semiconductor integrated circuit;

an abnormal operating circuit current determining circuit for determining a third current level representative of a discrimination current plus the pulse operating current;

comparing means for comparing the measured current to at least one of the second and third current levels; and power supply cut off signal generating means for generating the power supply cut off signal based on an output from the comparing means.

* * * * *